(12) United States Patent
Nemoto

(10) Patent No.: US 7,929,076 B2
(45) Date of Patent: Apr. 19, 2011

(54) OPTICAL MODULE AND OPTICAL PICKUP APPARATUS

(75) Inventor: Kazuhiko Nemoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 126 days.

(21) Appl. No.: 12/489,740

(22) Filed: Jun. 23, 2009

(65) Prior Publication Data
US 2009/0315042 A1 Dec. 24, 2009

(51) Int. Cl.
G02F 1/1335 (2006.01)

(52) U.S. Cl. .................. 349/61; 349/56; 349/62; 385/14

(58) Field of Classification Search ............ 349/56, 349/61, 62; 385/14
See application file for complete search history.

(56) References Cited

U.S. PATENT DOCUMENTS 5,317,195 A * 5/1994 Ishikawa et al. ............ 257/787
7,447,243 B2 * 11/2008 Aoshima et al. ............. 372/21

FOREIGN PATENT DOCUMENTS

| JP | 07-161065 | 6/1995 |
| JP | 11-251373 | 9/1999 |
| JP | 2000-048391 | 2/2000 |
| JP | 2000-228534 | 8/2000 |
| JP | 2001-351266 | 12/2001 |
| JP | 2006-048804 | 2/2006 |
| JP | 2006-338848 | 12/2006 |
| JP | 2007-035884 | 2/2007 |

OTHER PUBLICATIONS

Japanese Patent Office Action corresponding to Japanese Serial No. 2008-164136 dated Apr. 13, 2010.

* cited by examiner

Primary Examiner — Jennifer Doan
(74) Attorney, Agent, or Firm — SNR Denton US LLP

(57) ABSTRACT

An optical module includes: a base plate; a light emitting element mounted on the base plate; an integrated circuit element of the light receiving element built-in type mounted on the base plate by bonded wires and having a light receiving portion for receiving returning light originating from light emitted from the light emitting element; and a circuit board having a window for allowing light to pass therethrough and connected to the integrated circuit element in a state wherein the light receiving portion is exposed through the window.

9 Claims, 11 Drawing Sheets

UPPER FACE SIDE

TRANSVERSE SECTION

LOWER FACE SIDE

FIG. 6
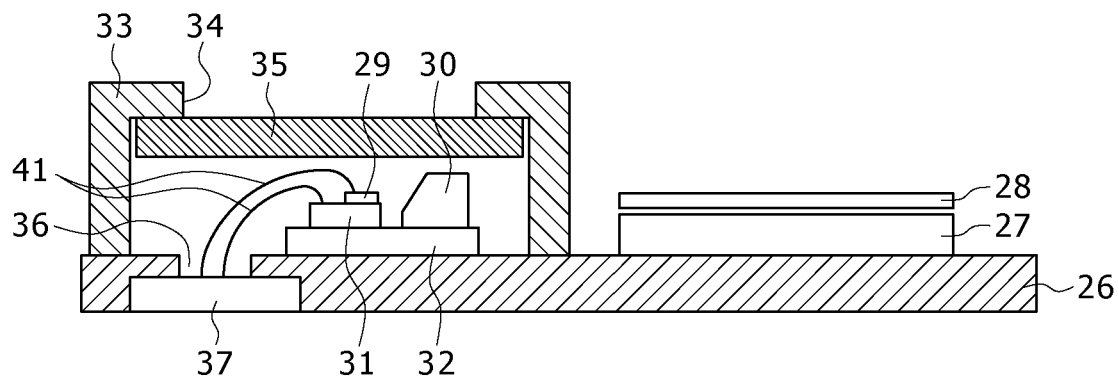
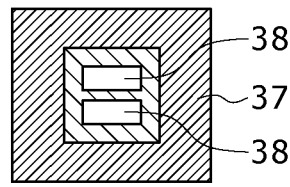
FIG.7A
UPPER FACE SIDE
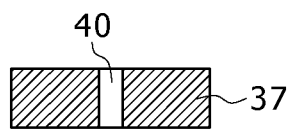
FIG.7B
TRANSVERSE SECTION
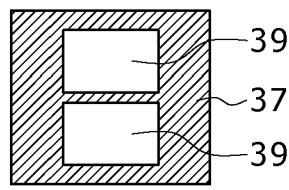
FIG.7C
LOWER FACE SIDE

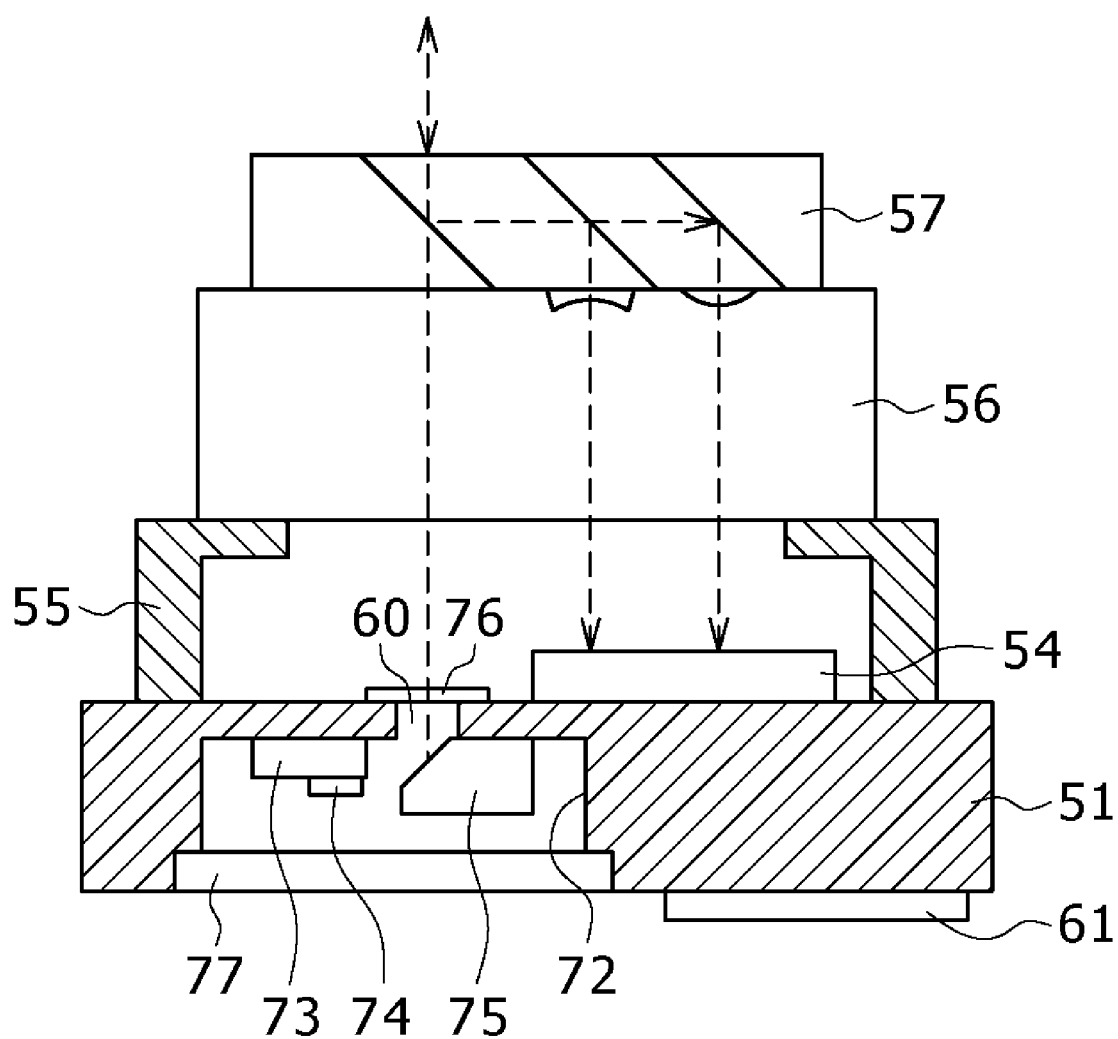

OPTICAL MODULE AND OPTICAL PICKUP APPARATUS

BACKGROUND OF THE INVENTION

1. Field of the Invention

This invention relates to an optical module and an optical pickup apparatus, and more particularly to an optical module wherein a light emitting element and a light receiving element are integrated and an optical pickup apparatus in which the optical module is incorporated.

2. Description of the Related Art

An optical disc recording and reproduction apparatus uses an optical disc such as a compact disc (CD) including a CD-R (compact disc recordable) and a CD-RW (compact disc rewritable), a digital versatile disc (DVD) or a Blu-ray disc (BD) as a recording medium to carry out recording and reproduction of data. The optical disc recording and reproduction apparatus includes an optical pickup apparatus for optically recording and reproducing data. As the optical pickup apparatus, an optical module or optical integration module is adopted wherein a light emitting element and a light receiving element are integrated in order to satisfy the demand for miniaturization or reduction in thickness. An optical pickup apparatus of the type described is disclosed, for example, in Japanese Patent Laid-Open No. 2007-18583.

In an optical pickup apparatus particularly for use with a BD from among various optical discs, if the light emitting element is not sealed, then an optical characteristic thereof is deteriorated. Therefore, in an optical pickup apparatus for use with a BD, a structure for sealing a light emitting element is adopted in order to maintain the reliability of operation.

FIG. 14 shows an example of a configuration of an optical module adopted in a related optical pickup apparatus. FIG. 15 is a sectional view taken along line A-A of FIG. 14. Referring to FIGS. 14 and 15, a light emitting apparatus 53 is attached to a lower side face of a base plate 51 using a holder member 52. An IC (optoelectronic integrated circuit (OEIC)) chip 54 in which a light receiving element is built is mounted on an upper face of the base plate 51. Further, a hologram lens 56 and a prism 57 which serves as a beam splitter are carried on the upper face of the base plate 51 through a housing 55.

Referring particularly to FIG. 16, the IC chip 54 is electrically connected or coupled to a plurality of electrode portions 58 provided on the upper face of the base plate 51 through wires 59 such as gold wires. The base plate 51 has an opening 60 formed therein for allowing light emitted from the light emitting apparatus 53 to pass therethrough. A flexible printed circuit board (hereinafter referred to sometimes as "FPC substrate") 61 is attached to the lower face of the base plate 51. The IC chip 54 is bonded to the upper face of the base plate 51 through a bonding layer 62 shown in FIG. 15. The FPC substrate 61 is electrically and mechanically connected to the base plate 51 through solder bonding portions 63. The IC chip 54 has a light receiving portion 64 on a principal face thereof. A plurality of terminal portions 65 for external connection are formed at an end portion of the FPC substrate 61 in the longitudinal direction.

The light emitting apparatus 53 has a CAN package structure. In particular, referring particularly to FIG. 14, a light emitting element 68 is mounted on a block 67 of a heat sink provided on a stem 66 through a sub mount not shown. The light emitting element 68 is sealed with a cap member 69 made of metal and attached to an upper face of the stem 66 in such a manner as to surround the light emitting element 68 and a light extracting window 70 which closes up an opening formed in the cap member 69. A plurality of terminal pins 71 are attached to the stem 66 and electrically connected to the light emitting element 68 by bonded wires or the like.

In the optical module having the configuration described above, light generated from the light emitting element 68 and emitted through the light extracting window 70 of the light emitting apparatus 53 is introduced into the hologram lens 56 through the opening 60 of the base plate 51. The light introduced in the hologram lens 56 passes through the prism 57 and is irradiated upon an external object such as an optical disc. Then, the light reflected by the external object, that is, returning light, is spectralized by the prism 57 and the hologram lens 56 and irradiated upon the light receiving portion 64 of the IC chip 54.

A configuration of another optical module adopted in a related optical pickup apparatus is shown in FIG. 17. Referring to FIG. 17, a recess 72 is formed integrally on a base plate 51, and a light emitting element 74 is mounted in the recess 72 through a sub mount 73 and also an upwardly directing mirror 75 is mounted in the recess 72. The space in the recess 72 in which the light emitting element 74 is mounted is sealed with a transmission window 76 which closes up the opening 60 of the base plate 51 and a lid member 77 which closes up the opposite side of the housing 55 to the opening 60. The remaining part of the optical module is common in configuration to that of the optical module described hereinabove with reference to FIG. 14.

In the optical module having the configuration described above, light emitted from the light emitting element 74 is reflected at the right angle by the upwardly directing mirror 75 and enters the hologram lens 56 through the transmission window 76. Further, the light entering the hologram lens 56 passes through the prism 57 and then is irradiated upon an external object such as an optical disc. Further, the light reflected by the external object, that is, returning light, is spectralized by the prism 57 and the hologram lens 56 and irradiated upon the light receiving portion of the IC chip 54.

SUMMARY OF THE INVENTION

In the optical module adopted in the related optical pickup apparatus, the IC chip 54 is mounted on the base plate 51 with the light receiving portion 64 directed upwardly in order to receive the returning light by means of the IC chip 54. Further, in order to electrically connect the IC chip 54 and the FPC substrate to each other through the base plate 51, the base plate 51 and the IC chip 54 are connected to each other by the bonded wires. Accordingly, it is necessary to ensure a region for the bonded wires, that is, a region in which the electrode portions 58 are to be formed, on the outer side of the region in which the IC chip 54 is mounted on the upper face of the base plate 51.

Further, if the number of electrodes of the IC chip increases, then the number of the electrode portions to be formed on the upper face of the base plate 51 or the number of electrode portions to be formed on the lower face of the base plate 51 increases accordingly. In such an instance, it is necessary to assure, on the upper face side of the base plate 51, a region for bonded wires which increase as the number of electrodes increases. Further, on the lower face side of the base plate 51, as the number of electrodes increases, it becomes necessary to change the array form of the electrode portions 58 from a form wherein the electrode portions 58 are arranged in a channel-shaped array as seen in FIG. 18A to another form wherein the electrode portions 58 are arranged in a grid-like array as seen in FIG. 18B. In such an instance, although the electrode arrangement shown in FIG. 18A allows visual confirmation of the soldering state, the electrode arrangement shown in FIG. 18B does not allow visual confirmation of the soldering state.

Further, in the related optical pickup apparatus, a ceramic plate of a laminated structure is used as the base plate 51. The reason why a ceramic plate of a laminated structure is used is that the degree of freedom in design in formation of the electrodes on the upper face and the lower face of the base plate 51 is high. However, conversely speaking, there is a restriction that only a material with which a laminated structure can be obtained can be selected as a material for the base plate 51. Therefore, a material which is high in heat radiation effect and is less expensive such as a metal material cannot be used.

According to an embodiment of the present invention, there is provided an optical module including a base plate, a light emitting element mounted on the base plate, an integrated circuit element of the light receiving element built-in type mounted on the base plate by bonded wires and having a light receiving portion for receiving returning light originating from light emitted from the light emitting element, and a circuit board having a window for allowing light to pass therethrough and connected to the integrated circuit element in a state wherein the light receiving portion is exposed through the window.

In the optical module, the circuit board having the window for allowing light to pass therethrough is mounted on the integrated circuit element such that the light receiving portion thereof is exposed, and the integrated circuit element is mounted on the base plate by die bonding. Therefore, the necessity to assure a region for bonded wires on the base plate is eliminated. Also the necessity to provide electrode portions or an electric path on or in the base plate is eliminated.

According to another embodiment of the present invention, there is provided an optical pickup apparatus including an optical module including a base plate, a light emitting element mounted on the base plate, an integrated circuit element of the light receiving element built-in type mounted on the base plate by bonded wires and having a light receiving portion for receiving returning light originating from light emitted from the light emitting element, and a circuit board having a window for allowing light to pass therethrough and connected to the integrated circuit element in a state wherein the light receiving portion is exposed through the window.

According the embodiments of the present invention, with the optical module, reduction in size and thickness can be anticipated. Further, limitation to the material or the structure of the base plate can be moderated significantly.

The above features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 6 is a schematic view showing a configuration of an optical module which includes an electrode terminal member having a different structure from that of the optical module of FIG. 4;

FIGS. 7A, 7B and 7C are a top plan view, a transverse sectional view and a bottom plan view, respectively, of the electrode terminal member shown in FIG. 6;

FIG. 17 is a schematic view showing a structure of an optical module adopted in another related optical pickup apparatus.

DETAILED DESCRIPTION OF THE PREFERRED EMBODIMENTS

First Embodiment

Figure 1:
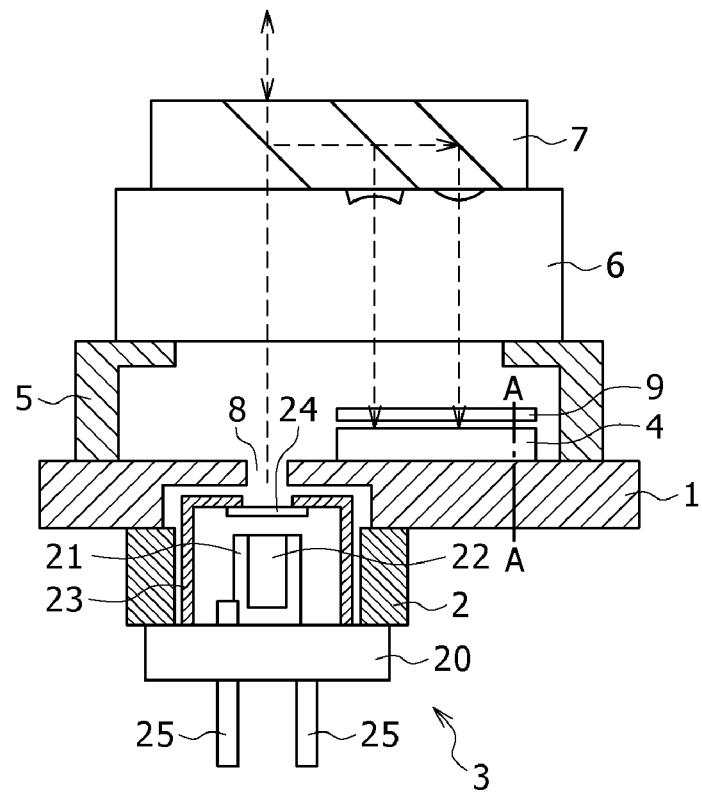
FIG. 1 is a schematic view showing a configuration of an optical module according to a first embodiment of the present invention.
Figure 2:
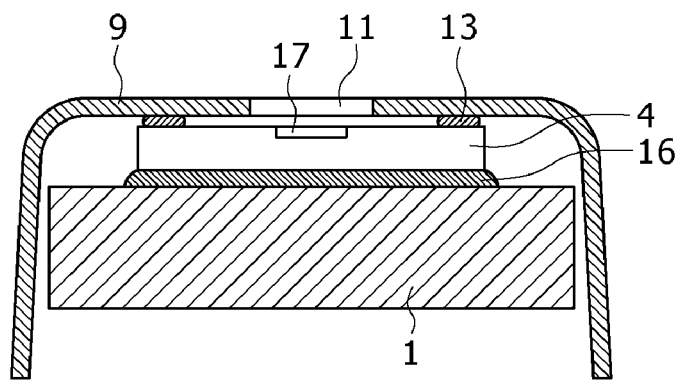
FIG. 2 is a sectional view taken along line A-A of FIG. 1.

Referring to FIGS. 1 and 2, there is shown a configuration of an optical module according to a first embodiment of the present invention. The optical module shown includes a light emitting apparatus 3 attached to a lower face of a base plate 1 using a holder member 2. The base plate 1 is formed as a plate of a rectangular shape as viewed in plan. An IC chip 4 is mounted on an upper face of the base plate 1. Further, an optical block including a hologram lens 6 and a prism 7 which serves as a beam splitter is carried on the upper face of the base plate 1 through a housing 5. The IC chip 4 is an OEIC having a light receiving element such as, for example, a photodiode built therein and serves as an integrated circuit element.

The housing 5 plays a role of a spacer for defining an attaching position of the hologram lens 6 or the prism 7 to the light emitting apparatus 3 or the IC chip 4 in a thicknesswise direction of the base plate 1, that is, in the heightwise direction of the optical module. The housing 5 is formed in a gate shape having an opening for allowing emitted light and returning light to pass therethrough. The lower face of the housing 5 is held in contact with the upper face of the base plate 1 on the outer side of the attached position of the light emitting apparatus 3 or the mounted position of the IC chip 4. The region on the inner side of the housing 5, that is, the region in which the IC chip 4 is mounted, is a non-sealed region which is open, for example, in the depthwise direction with respect to the plane of FIG. 1 or 2.

The base plate 1 has, for example, a single plate structure of a metal material. Preferably, the base plate 1 is formed using a die-cast plate or a pressed plate taking the cost and the accuracy into consideration. The base plate 1 has an opening 8 formed therein for allowing light emitted from the light emitting apparatus 3 to pass therethrough. Meanwhile, a flexible printed circuit board (hereinafter referred to sometimes as "FPC substrate") 9 is attached as an example of a circuit board to the lower face of the base plate 1.

Figure 3:
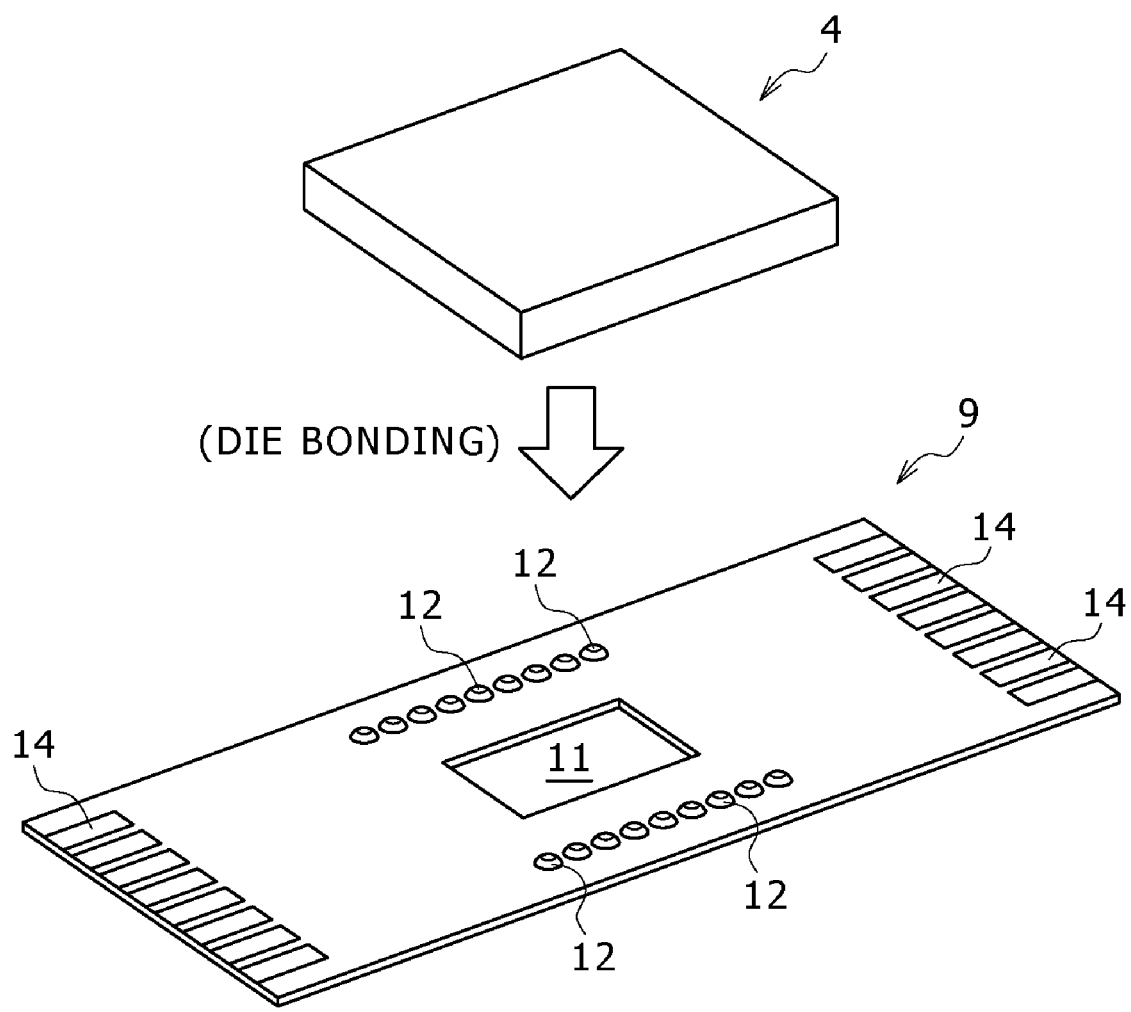
FIG. 3 is an exploded perspective view showing a connection structure of an IC chip and an FPC substrate used in the optical module of FIG. 1.

Here, a connection structure of the IC chip 4 and the FPC substrate 9 is described with reference to FIG. 3. The FPC substrate 9 is formed using, for example, a resin film of a rectangular shape or belt-like shape as a substrate. A window 11 in the form of a through-hole for allowing light to pass therethrough is formed at a mid portion of the FPC substrate 9. A plurality of electrode portions 12 are formed on a first face of the FPC substrate 9. The electrode portions 12 are arrayed, for example, in two rows around the window 11 in a corresponding relationship to arrangement of electrodes of the IC chip 4. The arraying direction of the electrode portions 12 coincides with the longitudinal direction of the FPC substrate 9. Further, a plurality of terminal portions 14 for external connection are formed on the first face of the FPC substrate 9. A plurality of such terminal portions 14 are formed at each of the opposite end portions of the FPC substrate 9 in the longitudinal direction. The terminal portions 14 are arrayed in a row in the lateral direction of the FPC substrate 9. Consequently, the arraying direction of the electrode portions 12 and the arraying direction of the terminal portions 14 are different by 90 degrees from each other on the first face of the FPC substrate 9. Further, the electrode portions 12 and the terminal portions 14 are electrically connected to each other through wiring line patterns not shown formed on the FPC substrate 9.

The IC chip 4 is mounted on the first face of the FPC substrate 9 with a light receiving portion thereof disposed in an opposing relationship, that is, in a face down state with respect, to the first face of the FPC substrate 9. The IC chip 4 is mounted on the FPC substrate 9 by a predetermined mounting method which uses bumps 13 shown in FIG. 2 such as, for example, ultrasonic mounting, anisotropic conductive mounting or soldering mounting. The bumps 13 may be formed, for example, in a stud bump structure on the electrode portions 12 of the FPC substrate 9 or at electrode portions not shown on the IC chip 4 side which are connection destinations of the electrode portions 12 or else on both of the electrode portions. The anisotropic conductive mounting is a mounting method which uses an anisotropic conductive film, an anisotropic conductive bonding agent or the like to establish electric and mechanical connection between the IC chip 4 and the FPC substrate 9. The ultrasonic mounting is a mounting method which utilizes ultrasonic energy to establish electric and mechanical connection between the IC chip 4 and the FPC substrate 9. The soldering mounting is a mounting method which uses soldering to establish electric and mechanical connection between the IC chip 4 and the FPC substrate 9.

The IC chip 4 mounted on the FPC substrate 9 is attached at the rear face thereof to the upper face of the base plate 1 by die bonding through a bonding agent 16 shown in FIG. 2 which is formed from a conductive bonding agent such as silver paste. The "die bonding" here signifies direct mounting of a bare IC chip to a substrate, in the present embodiment, to the base plate 1. The window 11 formed in the FPC substrate 9 is open upwardly. A light receiving portion 17 of the IC chip 4 is disposed in an opposing relationship to the opening of the window 11. Further, the IC chip 4 is mounted on the FPC substrate 9 in a state wherein the light receiving portion 17 is directed upwardly, that is, in a face up state. Therefore, at a location opposing to the IC chip 4, the first face of the FPC substrate 9 is disposed in a downwardly directed state, and the second face of the FPC substrate 9 is disposed in an upwardly directed state. The light receiving portion 17 is formed, for example, from a photodiode or the like. The longitudinal dimension of the FPC substrate 9 is set so as to be sufficiently greater than the lateral dimension of the base plate 1. One end portion and the other end portion of the FPC substrate 9 which extends from the region in which the IC chip 4 is mounted are disposed in a state wherein they are suspended to the lower face side of the base plate 1 bypassing the opposite side end faces of the base plate 1. It is to be noted that the shape of the FPC substrate 9 as viewed from the longitudinal direction of the base plate 1 can be changed freely by bending the FPC substrate 9 although it has a channel shape in the example shown in FIG. 2.

The light emitting apparatus 3 has a CAN package structure. The CAN package is a sealing structure of a package which uses a metal cap in the form of a can. In particular, a light emitting element 22 is mounted on a block 21 of the heat sink provided on a stem 20 through a sub mount not shown. The light emitting element 22 is formed from a semiconductor laser element or the like. The light emitting element 22 is sealed with a cap member 23 made of a metal and attached to the upper face of the block 21 in such a manner as to surround the light emitting element 22, and a light extracting window 24 which closes up an opening provided in the cap member 23. A plurality of terminal pins 25 are attached to the stem 20. The terminal pins 25 project at one end thereof to the upper face side of the stem 20 and project at the other end thereof to the lower face side of the stem 20. The terminal pins 25 are electrically connected to the light emitting element 22 by bonded wires.

In the optical module having the configuration described above, light generated by the light emitting element 22 and emitted through the light extracting window 24 is introduced into the hologram lens 6 through the opening 8 of the base plate 1. The light introduced in the hologram lens 6 passes through the prism 7 and is irradiated upon an external object such as an optical disc. The light reflected by the external object, that is, returning light, is spectralized by the prism 7 and the hologram 6 and irradiated upon the light receiving portion 17 of the IC chip 4.

In the optical module according to the first embodiment of the present invention, the IC chip 4 is mounted on the base plate 1 with the light receiving portion 17 directed upwardly and the window 11 for allowing light to pass therethrough is formed in the FPC substrate 9 while the IC chip 4 is mounted on the FPC substrate 9 such that the light receiving portion 17 is exposed through the window 11. Therefore, the following working effects (1) to (4) are achieved.

(1) The necessity for connection between the base plate 1 and the IC chip 4 by bonded wires is eliminated. Therefore, there is no necessity to assure a region for the bonded wires on the base plate 1. Accordingly, reduction in size and thickness can be anticipated.

(2) The necessity to provide an electrode portion on the upper and lower faces of the base plate 1 or to provide an electric path such as a via hole in the base plate 1 is eliminated. Therefore, the restriction to the material or the structure of the base plate 1 can be moderated significantly. Accordingly, the range of selection of the material for the base plate 1 is expanded. As a result, it becomes possible to select, for example, a metal material of a low cost having a high heat radiating property as a material for the base plate 1. This is advantageous in terms of the mass productivity and the cost. Further, together with the expansion of the range of material selection, it becomes easy to raise the heat radiating characteristic of the base plate 1. This is advantageous also in terms of the high-temperature reliability and so forth. Further, it becomes possible to form the base plate 1 from a single plate material having no wiring line structure. Therefore, the degree of freedom in selection of a material such as a metal plate obtained as a die-cast plate or a pressed plate, for example, a zinc die-cast plate, a copper plate, an aluminum plate or an aluminum nitride substrate is enhanced taking the heat radiating property, cost and so forth into consideration.

(3) Since the IC chip 4 and the FPC substrate 9 are connected directly to each other, unnecessary wiring or the like of wiring lines is eliminated. This is advantageous in enhancement of a performance of the IC chip 4 such as increase of the bandwidth and reduction of noise.

(4) The necessity for soldering of the FPC substrate 9 to the lower face of the base plate 1 is eliminated. Therefore, the problem that, where the number of electrodes increases in a grid type array, confirmation of a soldered state by visual observation is impossible can be eliminated. Further, where the anisotropic conductive mounting or the ultrasonic mounting is applied to mount the IC chip 4 on the FPC substrate 9, lower-temperature and dust-free mounting can be achieved in comparison with an alternative case wherein the soldering mounting is adopted. This is advantageous in terms of the reliability and the soil-free state.

Second Embodiment

Figure 4:
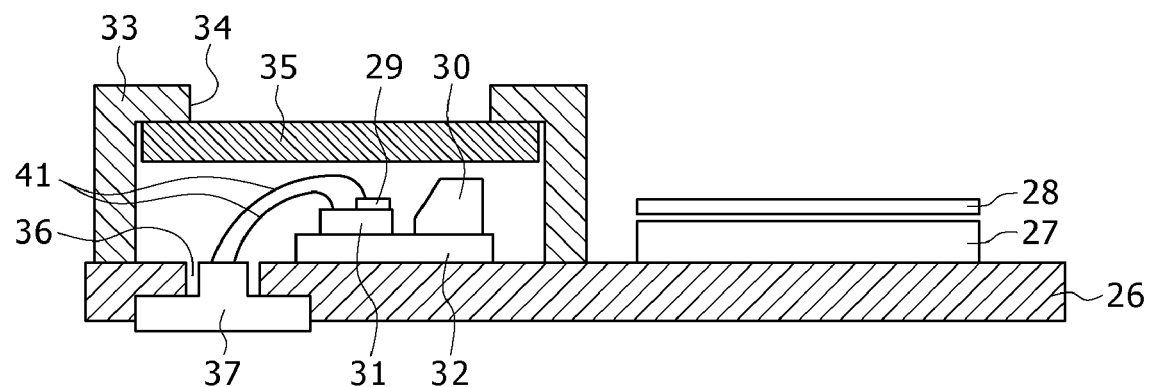
FIG. 4 is a schematic view showing a configuration of an optical module according to a second embodiment of the present invention.

FIG. 4 shows a configuration of an optical module according to a second embodiment of the present invention. Referring to FIG. 4, the optical module shown includes a base plate 26, an IC chip (OEIC) 27 and an FPC substrate 28 which are similar in structure to those of the optical module of FIG. 1. However, in the optical module of FIG. 4, the IC chip 27 is mounted on the upper face of the base plate 26 by die bonding, and the FPC substrate 28 is connected to the IC chip 27 using bumps not shown. The optical module of FIG. 4 is similar to the optical module of FIG. 1 in the mounting structure of the IC chip 27 on the base plate 26 and the attaching structure of the FPC substrate 28 to the IC chip 27. Further, in FIG. 4, an optical block composed of a hologram lens and a prism serving as a beam splitter is not shown.

On the upper face of the base plate 26, a light emitting element 29 and an upwardly directing mirror 30 are mounted together with the IC chip 27. The light emitting element 29 is formed from a semiconductor laser element or the like. The light emitting element 29 is mounted on the upper face of the base plate 26 through a first sub mount 31 and a second sub mount 32. The upwardly directing mirror 30 is mounted on the upper face of the base plate 26 through the second sub mount 32. In particular, the light emitting element 29 and the upwardly directing mirror 30 are mounted on the base plate 26 through the second sub mount 32 which serves as a common sub mount member. On the second sub mount 32, the light emitting element 29 and the upwardly directing mirror 30 are disposed in an opposing relationship to each other, that is, in a state wherein the light emitting point of the light emitting element 29 and the reflecting face in the form of an inclined face of the upwardly directing mirror 30 are opposed to each other. The first sub mount 31 and the second sub mount 32 are formed using, for example, AlN (aluminum nitride), silicon (Si) or the like.

Further, a cap member 33 is mounted on the upper face of the base plate 26. The cap member 33 is formed using a metal material such as, for example, nickel-plated Kovar (alloy formed from iron, nickel, cobalt and so forth) similar to that of a popular CAN package. The cap member 33 is attached to the upper face of the base plate 26 in a state wherein it surrounds the mounting region of the light emitting element 29 and the upwardly directing mirror 30 including the second sub mount 32. The cap member 33 is bonded and fixed at the lower face thereof to the base plate 26, for example, by resistance welding. An opening 34 is provided at an upper end face of the cap member 33. The opening 34 allows passage therethrough of light emitted from the light emitting element 29 and directed vertically upwardly by the upwardly directing mirror 30. The opening 34 is closed up with a lid member 35 formed, for example, from a transparent glass plate. The lid member 35 may be formed a material having a light transmitting property. The lid member 35 is bonded and fixed to the cap member 33 made of metal using low-melting point glass or some other bonding agent with which a high sealing property can be obtained.

A through-hole 36 is formed in the base plate 26. The through-hole 36 has a stepped structure wherein it is open with a small diameter on the upper face side of the base plate 26 but is open with a large diameter on the lower face side of the base plate 26. The through-hole 36 is provided in a neighboring relationship with the second sub mount 32. An electrode terminal member 37 is attached to a portion of the through-hole 36 of the base plate 26. The through-hole 36 of the base plate 26 is closed up with the electrode terminal member 37. The electrode terminal member 37 is attached, for example, by a bonding agent in such a state that it fits in the large diameter portion of the through-hole 36 from the lower face side of the base plate 26. Consequently, the mounting space for the light emitting element 29, upwardly directing mirror 30, first sub mount 31 and second sub mount 32 is sealed in an airtight state by the cap member 33, lid member 35 and electrode terminal member 37.

Figure 5A:
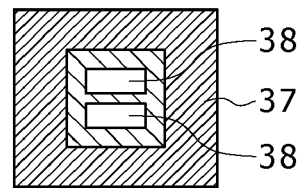
FIGS. 5A, 5B and 5C are a top plan view, a transverse sectional view and a bottom plan view, respectively, of an electrode terminal member used in the optical module of FIG. 4.
Figure 5B:
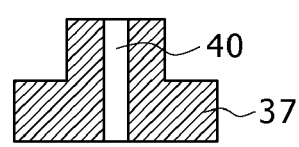
Figure 5C:
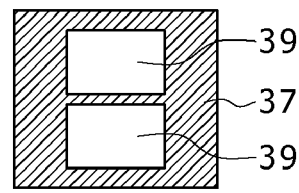

FIGS. 5A to 5C show a detailed structure of the electrode terminal member 37. The electrode terminal member 37 is formed in an inverted T shape in section. The electrode terminal member 37 is formed, for example, from a laminate of ceramics such that an upper end face thereof has a smaller area than a lower end face thereof. Further, the upper end face of the electrode terminal member 37 lies in flush with the upper face of the base plate 26. Two electrode portions 38 are provided on the upper end face of the electrode terminal member 37, and two electrode portions 39 are provided in a corresponding relationship to the electrode portions 38 on the lower end face of the electrode terminal member 37. Further, an electric path 40 such as a via hole is provided in the inside of the electrode terminal member 37. The electric path 40 establishes electric connection of corresponding ones of the electrode portions 38 and 39. The electric path 40 is formed, for example, by embedded metal.

The electrode terminal member 37 is electrically connected to the light emitting element 29 by bonded wires. More particularly, the light emitting element 29 is electrically connected or coupled to one of the two electrode portions 38 provided on the upper end face of the electrode terminal member 37 through a wire 41 of metal or the like. Meanwhile, the first sub mount 31 is electrically connected or coupled to the other one of the electrode portions 38 through another wire 41 of metal or the like. The light emitting element 29 is bonded at the lower face thereof to the first sub mount 31 by a bonding agent having conductivity such as metal paste. Therefore, the light emitting element 29 is electrically connected directly to the electrode terminal member 37 through one of the wires 41 and electrically connected to the electrode terminal member 37 through the first sub mount 31 and the other wire 41.

In the optical module having the configuration described above, light emitted from the light emitting element 29 is reflected at the right angle by the upwardly directing mirror 30 and introduced into the hologram not shown past the lid member 35. Further, the light introduced in the hologram passes through the prism not shown and is irradiated upon an external object such as an optical disc. Further, the light reflected by the external object, that is, returning light, is spectralized by the prism and the hologram not shown and irradiated upon the light receiving portion of the IC chip 27.

With the optical module according to the second embodiment of the present invention, the following working-effects are achieved in addition to working-effects similar to those achieved by the optical module according to the first embodiment of the present invention. In particular, since the optical module adopts the structure that the light emitting element 29 mounted on the base plate 26 is sealed with the cap member 33, lid member 35 and electrode terminal member 37, reduction in thickness can be achieved in comparison with an alternative case wherein a package structure of the CAN type is adopted. Further, since the through-hole 36 is formed in the base plate 26 and the electrode terminal member 37 is attached to the through-hole 36 to lead out the electrode portions 39, which are necessary for driving the light emitting element 29, to the outside, there is no necessity to provide an electrode portion on the base plate 26. Consequently, the degree of freedom in material selectivity for the base plate 26 is not deteriorated. Further, since the light emitting element 29 and the IC chip 27 in which the light receiving element is built are mounted on the upper face side of the base plate 26, the positional relationship between the light emitting portion and the light receiving portion can be set with a high degree of accuracy in comparison with an alternative case wherein a light emitting apparatus of the CAN type is mounted. Particularly where the base plate 26 is formed in a flat plate structure using, for example, a pressed metal plate, required accuracy for the relative position between the light emitting portion and light receiving portion can be achieved readily.

Further, since the first sub mount 31 on which the light emitting element 29 is mounted and the upwardly directing mirror 30 are mounted on the common second sub mount 32, optical positioning of the light emitting element 29 and the upwardly directing mirror 30 can be carried out on the second sub mount 32. Therefore, the light emitting element 29 and the upwardly directing mirror 30 can be mounted on the base plate 26 in a state wherein the positional relationship between them is assured. Accordingly, sufficient relative positional accuracy among the light emitting element 29, upwardly directing mirror 30 and IC chip 27 can be achieved readily.

It is to be noted that the structure for sealing the mounting space for the light emitting element 29 may not be the structure by the cap member 33 and the lid member 35 but be another structure that, for example, a metal cap with a glass window which is adopted by a CAN package is attached to the upper face of the base plate 26 by resistance welding or the like.

It is to be noted that the electrode terminal member 37 is not limited to a laminate of ceramics but may be a single layer element, for example, of silicon. In particular, such a configuration as shown in FIG. 6 may be used wherein the electrode terminal member 37 which is formed from a single layer element of silicon is attached to a portion of the base plate 26 at the through-hole 36 as seen in FIG. 6. In this instance, such a structure that two electrode portions 38 and two electrode portions 39 corresponding to each other are provided on the upper face and the lower face of the electrode terminal member 37 and an electric path 40 for electrically connecting the electrode portions 38 and 39 is provided in the inside of the electrode terminal member 37 as seen in FIG. 7 may be adopted.

Further, the main material of the electrode terminal member 37 is not limited to a material having an insulating property but may be a material having conductivity. However, in this instance, upon formation of the electrode portions 38 and 39 or upon formation of the electric path 40, it is necessary to apply, for example, an insulating coating process in order to maintain electric insulation between the electrode portions 38 and 39 or the electric path 40 and the main material of the electrode terminal member 37 which has conductivity. Accordingly, the fabrication process is facilitated where a material having insulation is used for the main material of the electrode terminal member 37.

Now, modifications to the optical module according to the second embodiment of the present invention are described.

First Modification

Figure 8:
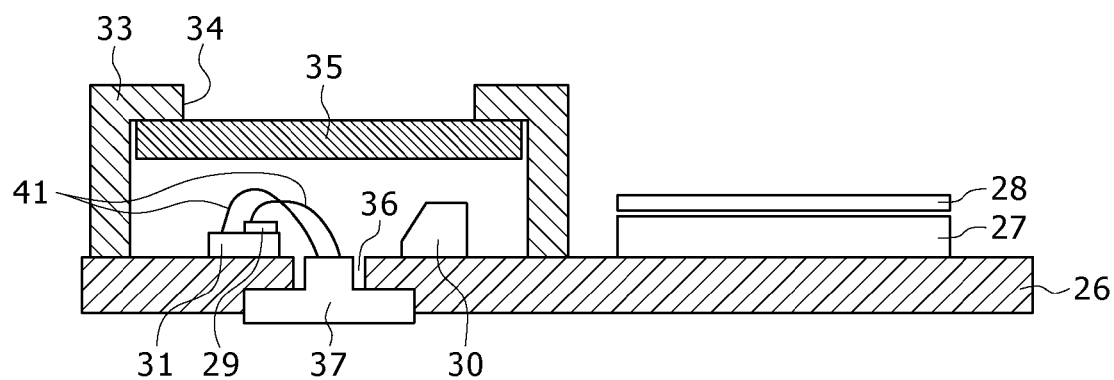
FIGS. 8 to 13 are schematic views showing first to sixth modifications to the optical module of FIG. 4.

FIG. 8 schematically shows a first modification to the optical module according to the second embodiment of the present invention. Referring to FIG. 8, the modified optical module is configured such that the light emitting element 29 is mounted on the upper face of the base plate 26 through the first sub mount 31 without using the second sub mount 32 described hereinabove and the upwardly directing mirror 30 is mounted on the upper face of the base plate 26. In other words, the light emitting element 29 and the upwardly directing mirror 30 are mounted individually on the base plate 26. Further, the through-hole 36 is provided between the mounted position of the first sub mount 31 and the mounted position of the upwardly directing mirror 30, and the electrode terminal member 37 formed from a laminate of ceramics is attached to the through-hole 36 while the light emitting element 29 and the electrode terminal member 37 are electrically connected to each other by bonded wires. The positions of the wires 41 are set in a displaced relationship, for example, in the depthwise direction with respect to the plane of FIG. 8 from the path of light emitted from the light emitting element 29 toward the upwardly directing mirror 30 so that the wires 41 may not interfere with the light path. With the configuration described, optical positioning of the light emitting element 29 and the upwardly directing mirror 30 is carried out on the base plate 26. In this instance, a well-known fabrication process for a laser coupler can be applied. This is advantageous in terms of the mass productivity and the cost reduction.

Second Modification

Figure 9:
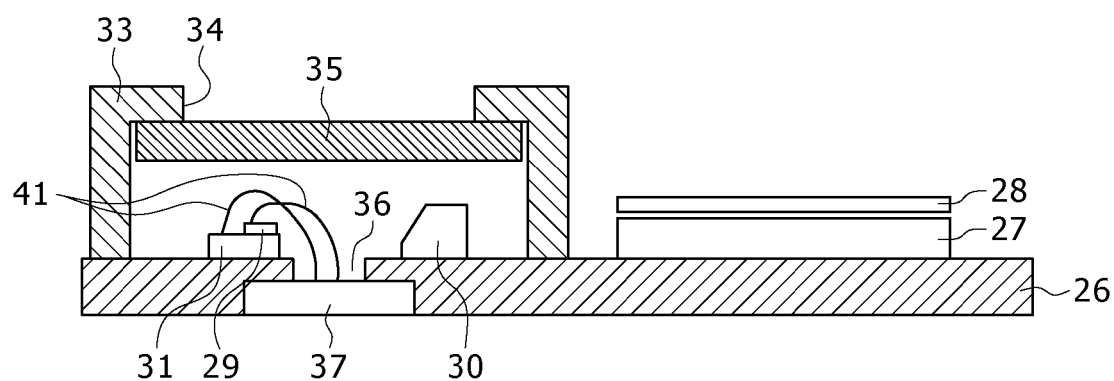

FIG. 9 schematically shows a second modification to the optical module according to the second embodiment of the present invention. Referring to FIG. 9, the optical module of the second modification is different from that of the first modification in the configuration of the electrode terminal member 37. In particular, while the electrode terminal member 37 of the optical module of the first modification is formed from a laminate of ceramics, the electrode terminal member 37 of the optical module of the second modification is formed from a single layer element of silicon. It is to be noted that, while it is described in description of several modifications described below that the electrode terminal member 37 is formed from a laminate of ceramics, it is possible to form, in all of such modifications, the electrode terminal member 37 from a single layer element of silicon.

Third Modification

Figure 10:
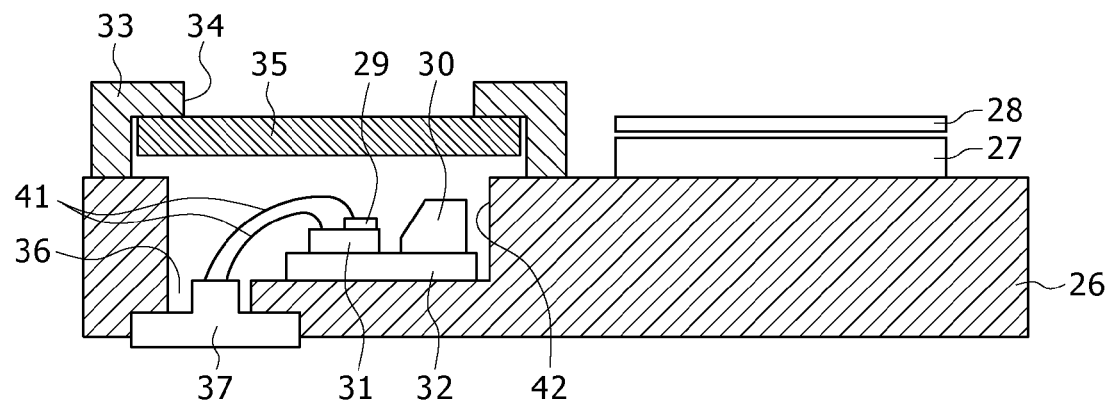

FIG. 10 schematically shows a third modification to the optical module according to the second embodiment of the present invention. In the present third modification, a recess 42 is formed on the base plate 26, and the light emitting element 29, upwardly directing mirror 30, first sub mount 31 and second sub mount 32 described hereinabove are mounted in the recess 42. Further, the through-hole 36 is formed in the base plate 26 in such a state that it is open to the bottom face of the recess 42, and the electrode terminal member 37 is attached to the through-hole 36 and the light emitting element 29 and the electrode terminal member 37 are electrically connected to each other by bonded wires.

Fourth Modification

Figure 11:
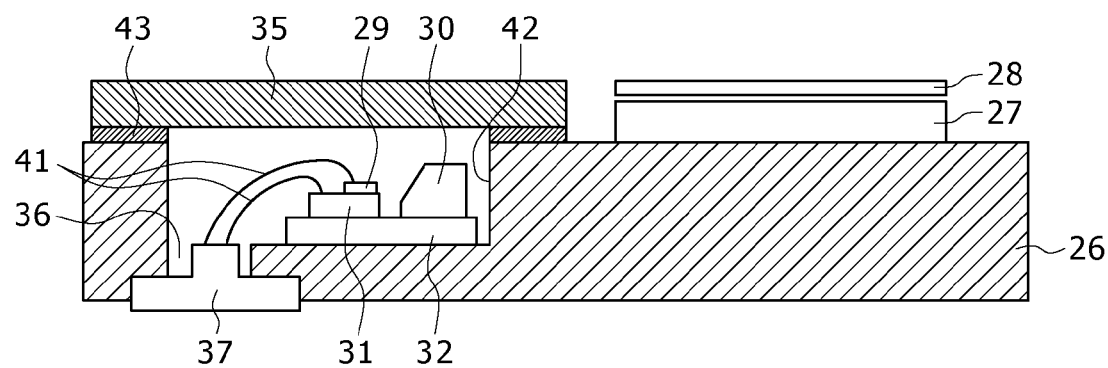

FIG. 11 schematically shows a fourth modification to the optical module according to the second embodiment of the present invention. Referring to FIG. 11, in the present fourth modification, when compared with the third modification, the lid member 35 made of glass is bonded directly to the upper face of the base plate 26 by a bonding layer 43 without using the cap member 33. The bonding layer 43 is formed using low-melting point glass or some other bonding agent with which a high sealing property can be achieved.

Fifth Modification

Figure 12:
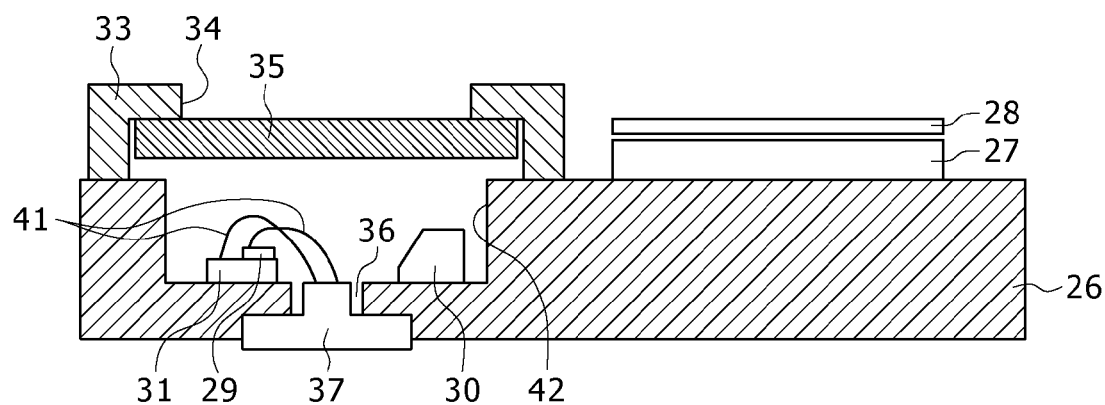

FIG. 12 schematically shows a fifth modification to the optical module according to the second embodiment of the present invention. Referring to FIG. 12, in the present fifth modification, the light emitting element 29 is mounted on the upper face of the base plate 26 through the first sub mount 31 and the upwardly directing mirror 30 is mounted on the upper face of the base plate 26 without using the second sub mount 32 described hereinabove similarly as in the first modification described hereinabove. Further, the through-hole 36 is provided between the mounted position of the first sub mount 31 and the mounted position of the upwardly directing mirror 30, and the electrode terminal member 37 formed from a laminate of ceramics is attached to the through-hole 36 while the light emitting element 29 and the electrode terminal member 37 are electrically connected to each other by bonded wires. Further, in the present fifth modification, the recess 42 is formed on the base plate 26 and the light emitting element 29, upwardly directing mirror 30, first sub mount 31 and second sub mount 32 described hereinabove are mounted in the recess 42 similarly as in the third modification described hereinabove. Furthermore, the through-hole 36 is formed in the base plate 26 in such a manner as to open to the bottom face of the recess 42, and the electrode terminal member 37 is attached to the through-hole 36 and the light emitting element 29 and the electrode terminal member 37 are electrically connected to each other by bonded wires.

Sixth Modification

Figure 13:
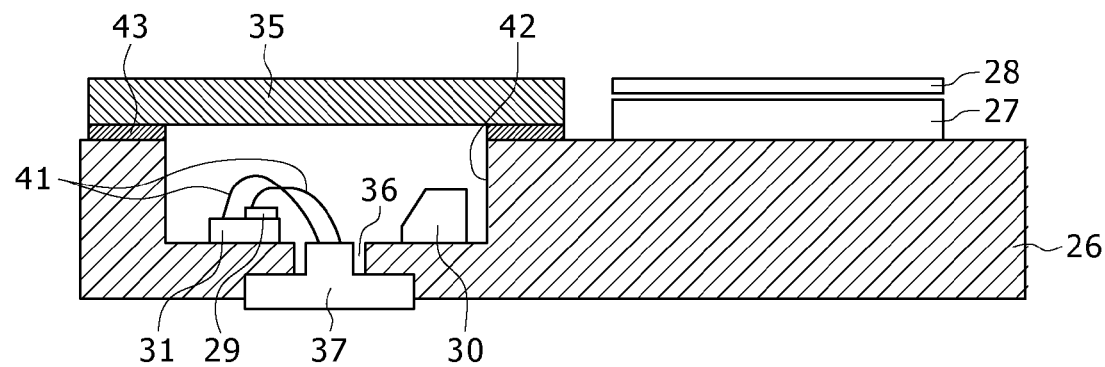
Figure 14:
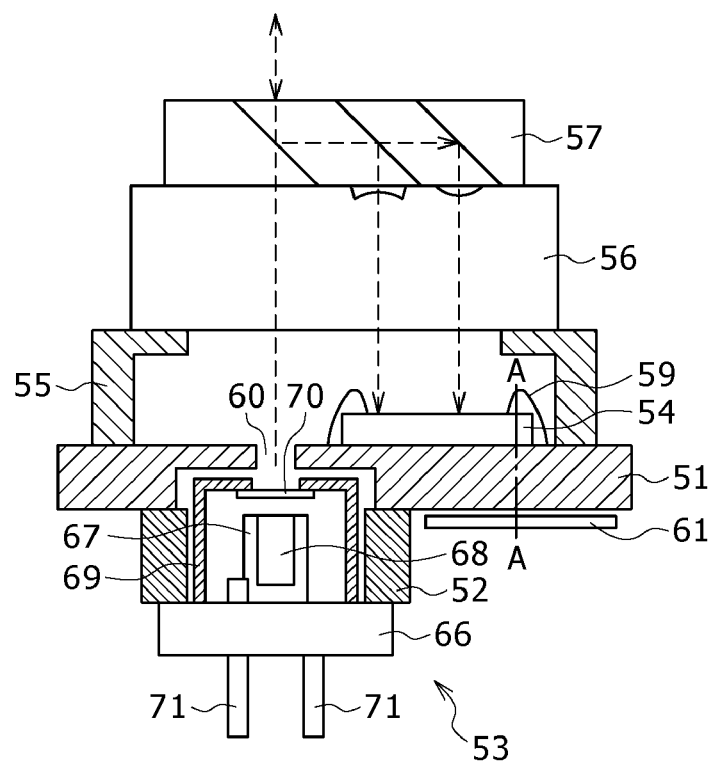
FIG. 14 is a schematic view showing an example of a configuration of an optical module adopted in a related optical pickup apparatus.
Figure 15:
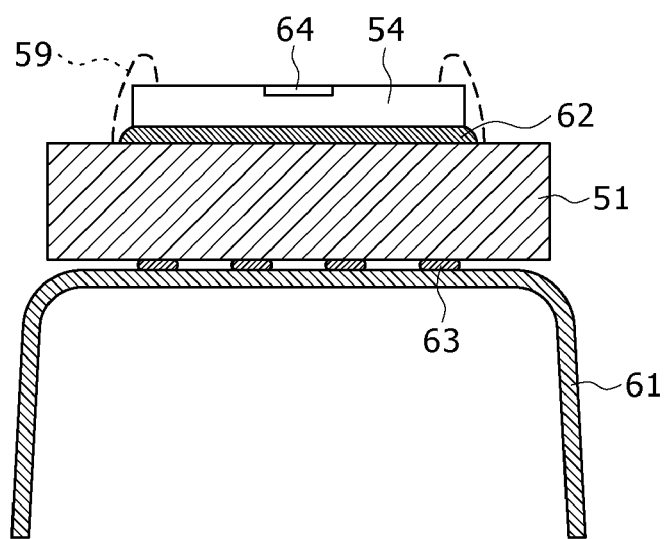
FIG. 15 is a sectional view taken along line A-A of FIG. 14.
Figure 16:
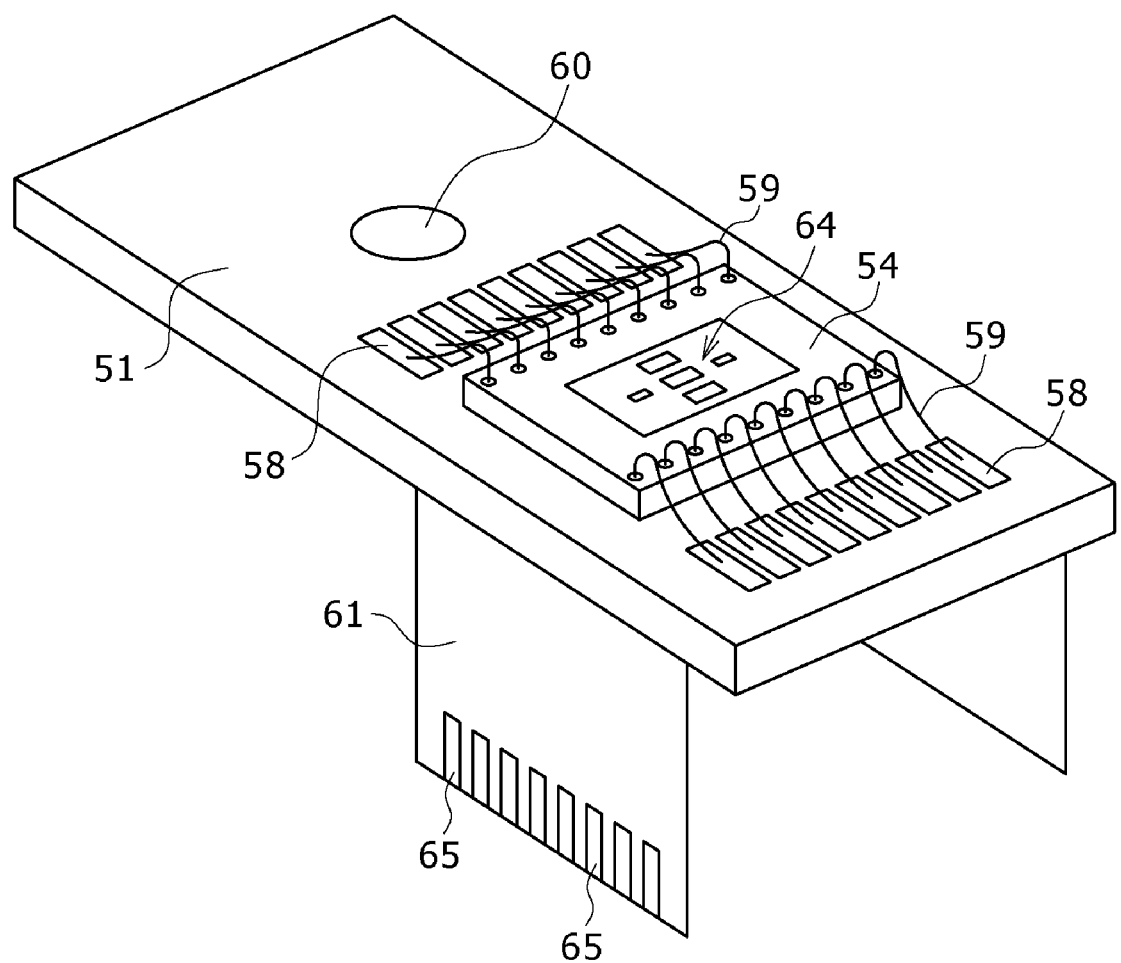
FIG. 16 is a perspective view showing a structure of part of the related optical module of FIG. 14.
Figure 18A:
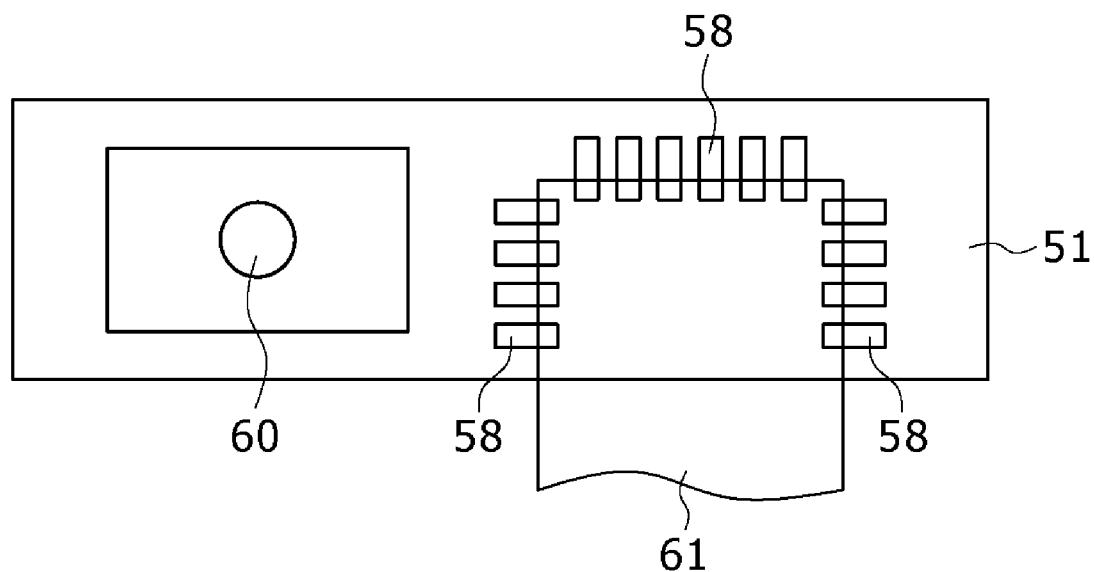
FIGS. 18A and 18B are schematic views showing different connection structures between a base plate and an FPC substrate.
Figure 18B:
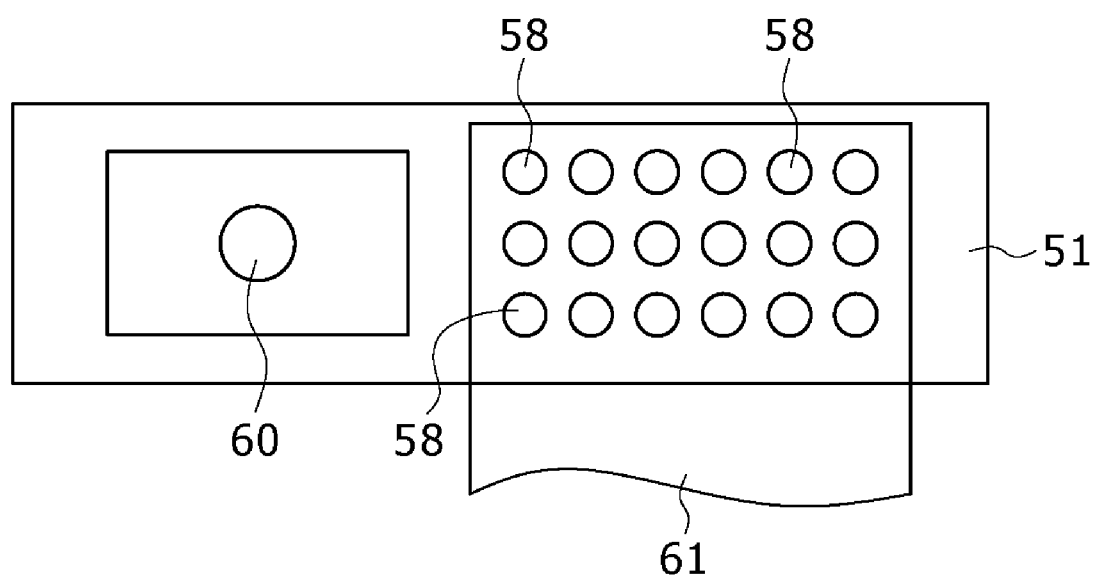

FIG. 13 schematically shows a sixth modification to the optical module according to the second embodiment of the present invention. Referring to FIG. 13, in the present sixth modification, the light emitting element 29 is mounted on the upper face of the base plate 26 through the first sub mount 31 and the upwardly directing mirror 30 is mounted on the upper face of the base plate 26 without using the second sub mount 32 described hereinabove similarly as in the first modification described hereinabove. Further, the through-hole 36 is provided between the mounted position of the first sub mount 31 and the mounted position of the upwardly directing mirror 30, and the electrode terminal member 37 formed from a laminate of ceramics is attached to the through-hole 36 while the light emitting element 29 and the electrode terminal member 37 are electrically connected to each other by bonded wires. Further, in the present sixth modification, the recess 42 is formed on the base plate 26 and the light emitting element 29, upwardly directing mirror 30, first sub mount 31 and second sub mount 32 described hereinabove are mounted in the recess 42 similarly as in the third modification described hereinabove. Furthermore, the through-hole 36 is formed in the base plate 26 in such a manner as to open to the bottom face of the recess 42, and the electrode terminal member 37 is attached to the through-hole 36 and the light emitting element 29 and the electrode terminal member 37 are electrically connected to each other by bonded wires. In addition, in the sixth embodiment, the lid member 35 of glass is bonded directly to the upper face of the base plate 26 through the bonding layer 43 without using the cap member 33 similarly as in the fourth embodiment described hereinabove.

The present invention can be implemented also as an optical pickup apparatus which uses any of the optical modules of the embodiments and modifications described hereinabove. Further, the present invention can be implemented also as an optical disc recording and reproduction apparatus which includes the optical pickup apparatus. Furthermore, the present invention can be applied not only to optical discs but also widely to various optical devices for which miniaturization or reduction in thickness is required.

The present application contains subject matter related to that disclosed in Japanese Priority Patent Application JP 2008-164136 filed in the Japan Patent Office on Jun. 24, 2008, the entire content of which is hereby incorporated by reference.

While preferred embodiments of the present invention have been described using specific terms, such description is for illustrative purpose only, and it is to be understood that changes and variations may be made without departing from the spirit or scope of the following claims.

What is claimed is:

1. An optical module, comprising:
   a base plate;
   a light emitting element mounted on said base plate;
   an integrated circuit element of the light receiving element built-in type mounted on said base plate by bonded wires and having a light receiving portion for receiving returning light originating from light emitted from said light emitting element; and
   a circuit board having a window for allowing light to pass therethrough and connected to said integrated circuit element in a state wherein said light receiving portion is exposed through said window.

2. The optical module according to claim 1, wherein said base plate has a through-hole,
   said optical module further comprising an electrode terminal member attached to a portion of said base plate at the through-hole in such a state as to close up the through-hole,
   said light emitting element being electrically connected to said electrode terminal member.

3. The optical module according to claim 2, wherein said base plate is formed using a die-cast plate or a pressed plate.

4. The optical module according to claim 2, wherein said integrated circuit element and said circuit board are electrically and mechanically connected to each other by ultrasonic mounting or anisotropic conductive mounting.

5. The optical module according to claim 2, further comprising
   an upwardly directing mirror for reflecting light emitted from said light emitting element vertically, said light emitting element and said upwardly directing mirror being mounted on said base plate through a common sub mount member.

6. The optical module according to claim 2, further comprising
an upwardly directing mirror for reflecting light emitted from said light emitting element vertically,
said light emitting element and said upwardly directing mirror being individually mounted on said base plate.

7. The optical module according to claim 1, wherein
said base plate is formed using a die-cast plate or a pressed plate.

8. The optical module according to claim 1, wherein,
said integrated circuit element and said circuit board are electrically and mechanically connected to each other by ultrasonic mounting or anisotropic conductive mounting.

9. An optical pickup apparatus, comprising
an optical module including
a base plate,
a light emitting element mounted on said base plate,
an integrated circuit element of the light receiving element built-in type mounted on said base plate by bonded wires and having a light receiving portion for receiving returning light originating from light emitted from said light emitting element, and
a circuit board having a window for allowing light to pass therethrough and connected to said integrated circuit element in a state wherein said light receiving portion is exposed through said window.

* * * * *

UNITED STATES PATENT AND TRADEMARK OFFICE
CERTIFICATE OF CORRECTION

| | | |
|---|---|---|
| PATENT NO. | : 7,929,076 B2 | Page 1 of 1 |
| APPLICATION NO. | : 12/489740 | |
| DATED | : April 19, 2011 | |
| INVENTOR(S) | : Kazuhiko Nemoto | |

It is certified that error appears in the above-identified patent and that said Letters Patent is hereby corrected as shown below:

On the Title page of the patent:

Please add:

(30) Foreign Application Priority Data

--Jun. 24, 2008 (JP) P2008-164136--

Signed and Sealed this
Fifth Day of July, 2011

David J. Kappos
*Director of the United States Patent and Trademark Office*